United States Patent
Lee et al.

(10) Patent No.: US 6,377,496 B1
(45) Date of Patent: Apr. 23, 2002

(54) WORD LINE VOLTAGE REGULATION CIRCUIT

(75) Inventors: Poong Yeub Lee; Im Cheol Ha, both of Kungki-Do; Kye Wan Shin, Seoul; Oh Won Kwon, Kyungki-Do; Sung Hwan Seo, Seoul, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,490

(22) Filed: Nov. 28, 2000

(30) Foreign Application Priority Data

Dec. 29, 1999 (KR) .............................................. 99-65146

(51) Int. Cl.$^7$ ................................................. G11C 7/00
(52) U.S. Cl. .............................. 365/189.09; 365/189.07
(58) Field of Search ........................ 365/189.09, 189.07

(56) References Cited

U.S. PATENT DOCUMENTS 5,402,375 A * 3/1995 Horiguchi et al. ..... 365/189.09

* cited by examiner

*Primary Examiner*—David Nelms
*Assistant Examiner*—M. Tran
(74) *Attorney, Agent, or Firm*—Pennie & Edmonds LLP

(57) ABSTRACT

A word line voltage regulation circuit includes a first comparator for comparing a first reference voltage and the potential of an output node; a first switching element for supplying the supply voltage to the output node depending on the output signal of the first comparator; a second comparator for comparing a second reference voltage and the potential of the output node; a second switching element for regulating the potential of the output node depending on the output signal of the second comparator; a third switching element for transmitting the potential of the output node to a decoder circuit depending on a first control signal; and a fourth switching element for supplying the supply voltage to the decoder circuit depending on a second control signal.

18 Claims, 4 Drawing Sheets

WORD LINE VOLTAGE REGULATION CIRCUIT

FIELD OF THE INVENTION

The invention relates generally to a word line voltage regulation circuit, and more particularly to, a word line voltage regulation circuit capable of preventing a wrong reading of a cell, in such a manner that as the supply voltage is increased up to 4.5V, the voltage applied to the gate is increased, but when the supply voltage is increased over 4.5V, the voltage applied to the gate is regulated to 4.5V, thus sufficiently securing read-out margin.

BACKGROUND OF THE INVENTION

FIG. 1 is a characteristic graph of a cell current depending on the gate bias in the conventional flash memory cell. Conventionally, in order to read out the flash memory cell, a voltage of 0.8V is applied to the drain and the supply voltage Vcc that is the voltage used in the chip is applied to the gate. When the flash memory cell is usually programmed, the distribution of the threshold voltage in the cell is about 5V~7V. Therefore, when the read-out operation is performed, the worst case is that the program threshold voltage of the cell is the lowest, that is, about 5V.

FIG. 2 is a characteristic graph of a cell current depending on the variations in the supply power in case that the conventional method is employed. This is a graph of a read-out margin when the threshold voltage of a basis cell is 2V, the supply voltage is applied to the gates of a main cell and the reference cell, and the data of the main cell is read using 1⅓ of the reference cell current. In other words, when a L2 line is based on, a L1 line is an erase cell current curve and a L3 line is a program cell current curve. As the program threshold voltage is 5V, when the supply voltage, that is, the voltage applied to the gate is below 5V, there is little changes in the program cell current. However, when the supply voltage is increased over 5V, the program cell current starts increasing rapidly. Thus, as the supply voltage is increased over 5V, the read-out margin on the program cell side is reduced. In other words, as the read-out margin is reduced, it sensitively responds the program cell current. Also, in case that the supply voltage is over 6.5V, it is wrongly read out that the cell is erased.

SUMMARY OF THE INVENTION

It is therefore an object of the present invention to provide a word line voltage regulation circuit in which a constant voltage can be applied to the gate even at a high supply voltage when a flash memory cell is read out so that a sufficient read-out margin can be secured, thus preventing a wrong reading of the cell to increase the operational reliability of a device.

In order to accomplish the above object, a word line voltage regulation circuit according to the present invention is characterized in that it comprises a first comparator for comparing a first reference voltage and the potential of an output node; a first switching means for supplying the supply voltage to the output node depending on the output signal of the first comparator; a second comparator for comparing a second reference voltage and the potential of the output node; a second switching means for regulating the potential of the output node depending on the output signal of the second comparator; a third switching means for transmitting the potential of the output node to a decoder circuit depending on a first control signal; and a fourth switching means for supplying the supply voltage to the decoder circuit depending on a second control signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
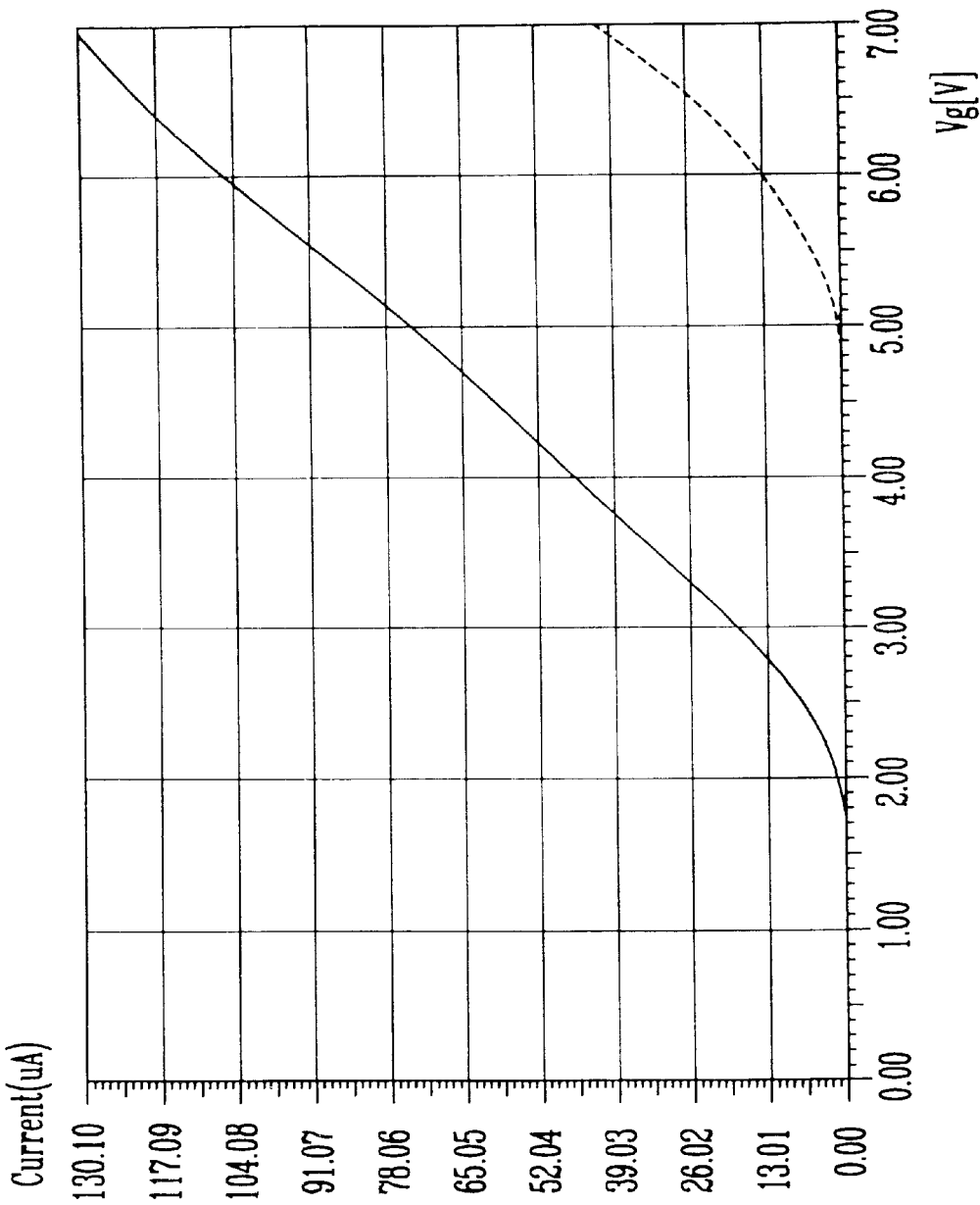
FIG. 1 is a characteristic graph of a cell current depending on the gate bias in the conventional flash memory cell.
Figure 2:
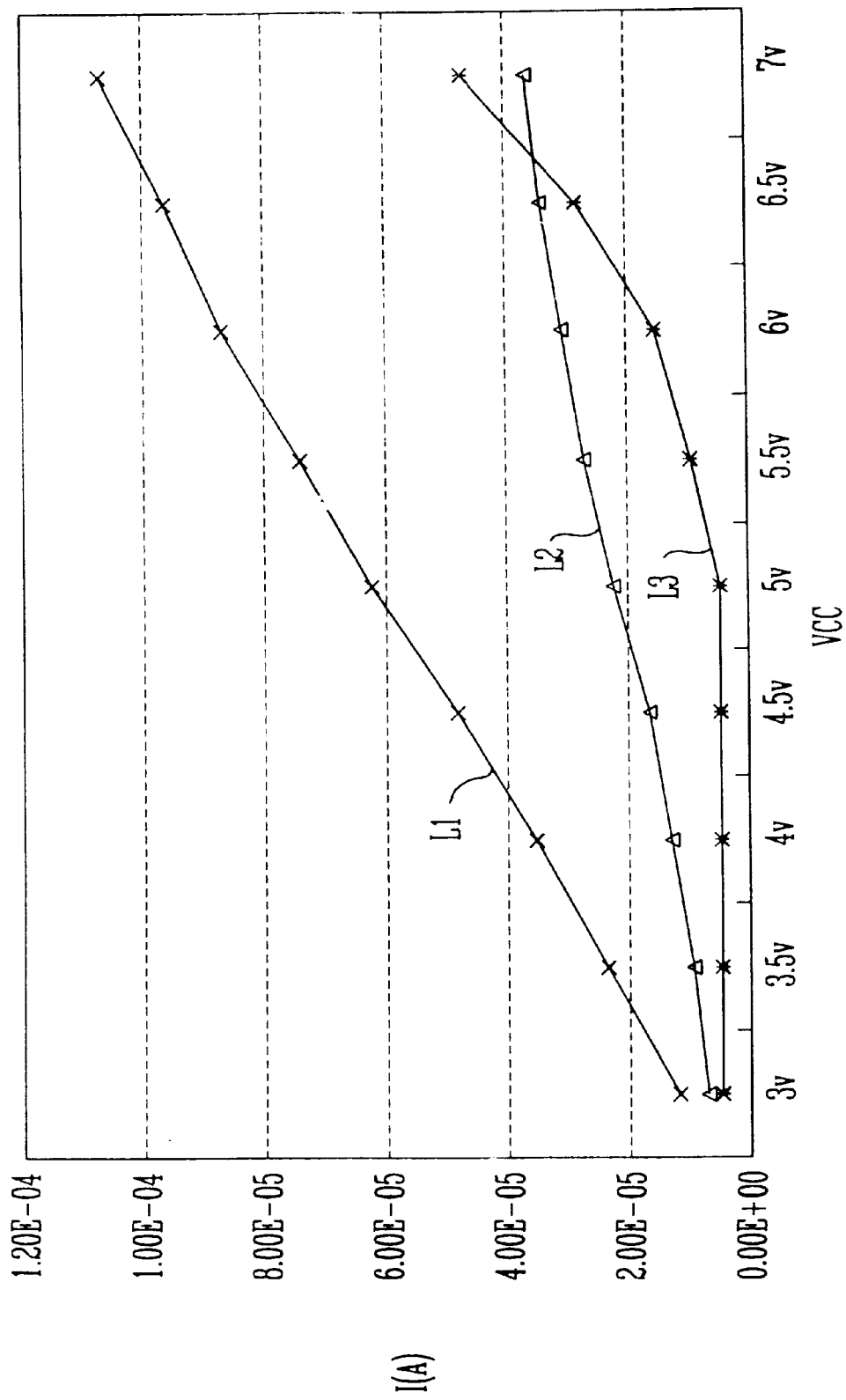
FIG. 2 is a characteristic graph of a cell current depending on the variations in the supply power in case that the conventional method is used.

The present invention will be described in detail by way of a preferred embodiment with reference to accompanying drawings, in which like reference numerals are used to identify the same or similar parts.

In the present invention, as the supply voltage of the word line voltage is increased up to 4.5V, the voltage applied to the gate is increased, but when the supply voltage is increased over 4.5V the voltage applied to the gate is regulated to 4.5V. Thus, it can sufficiently secure the read-out margin, thus preventing a wrong reading of a cell.

Figure 3:
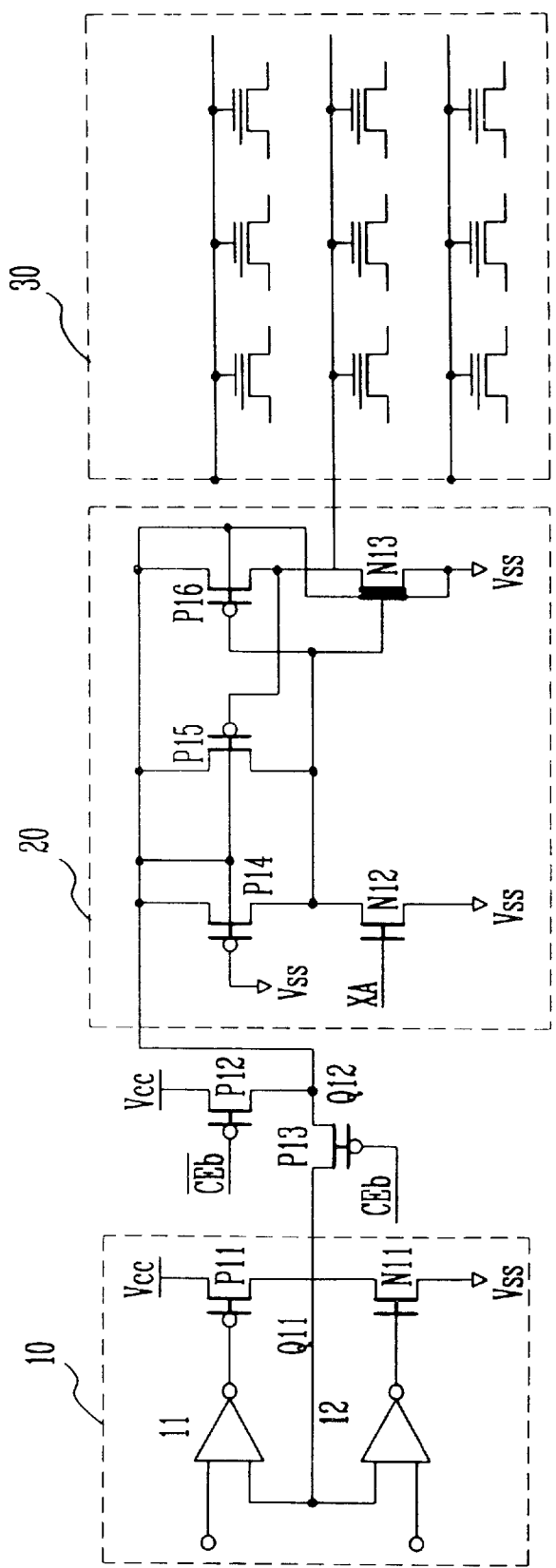
FIG. 3 is a circuit diagram for illustrating the connection relationship between a regulation circuit and a decoder, and a cell array according to one embodiment of the present invention.

FIG. 3 is a circuit diagram for illustrating the connection relationship between a word line voltage regulation circuit and a decoder, and a memory cell array according to one embodiment of the present invention.

The word line regulation circuit 10 is for generating a regulated gate voltage and the decoder circuit 20 is for applying a regulated voltage to specific word lines of the memory cell array 30.

As the decoder circuit 20 and the memory cell 30 are conventional ones, only the construction of the regulation circuit 10 will be explained as follow.

A first comparator 11 receives a reference voltage of about 4.45V, compares it with the potential of a first node Q11 and then outputs a signal depending on the comparison. A first PMOS transistor P11 is connected between the terminal of the supply power and the first node Q11 and is driven depending the output signal of the first comparator 11. On the other hand, a second comparator 12 receives a reference voltage of about 4.55V, compares it with the potential of the first node Q11 and then outputs a signal depending on the comparison. A first NMOS transistor N11 is connected between the first node Q11 and the ground terminal Vss and is driven depending the output signal of the second comparator 12. A third PMOS transistor P13 connected between the first node Q11 and the second node Q12 being the input terminal of the decoder circuit 20 is driven depending on a chip enable bar signal CEb signal. Then, a second PMOS transistor P12 connected between the terminal of the supply power and the second node Q12 is driven depending on the inverted signal of the chip enable bar signal /CEb, that is, it is driven depending on a chip enable signal delayed by given time.

A method of driving the word line voltage regulation circuit according to the present invention constructed above will be explained as follows.

When the chip is at a standby state, as the chip enable bar signal CEb is applied as a High state, the second PMOS transistor P12 driven depending on the chip enable bar signal /CEb that is inverted into a Low state is turned on, thus applying the supply voltage Vcc to the input terminal of the decoder circuit 20. Therefore, the N-well of the fourth to sixth PMOS transistors P14 to P16 in the decoder circuit 20 is charged into the supply voltage Vcc. Of course, at this time, any word lines are not selected.

When the chip is enabled, as the chip enable bar signal CEb is applied as a Low state, the second PMOS transistor P12 is turned off and the third PMOS transistor P13 is turned on, thus applying the regulated voltage outputted from the word line voltage regulation circuit 10 to the input terminal of the decoder circuit 20.

When the chip is at a standby state, the fourth to sixth PMOS transistors P14 to P16 in the decoder circuit 20 is charged with the supply voltage Vcc. Thus, there exists a second NMOS transistor N12 for increasing the charged voltage to a higher voltage than the regulated voltage. The second NMOS transistor N12 is turned on only when the first node Q11 is maintained over 4.55V by the second comparator 12 and is turned off when it is below 4.55V. Thereafter, at the time when the potential of the first node Q11 falls to 4.45V by the leak current caused by the second NMOS transistor N12 in the decoder circuit 20, a sixth PMOS transistor P16 is turned on, thus again increasing the potential of the first node Q11. As the two comparators are operated as mentioned above, the potential of the first node Q11 can be maintained at about 4.45~4.55V. This regulated voltage is transmitted to the fourth to sixth PMOS transistors P14 to P16 in the decoder circuit 20 via the third PMOS transistor P13 and is also transmitted to selected word lines.

Figure 4:
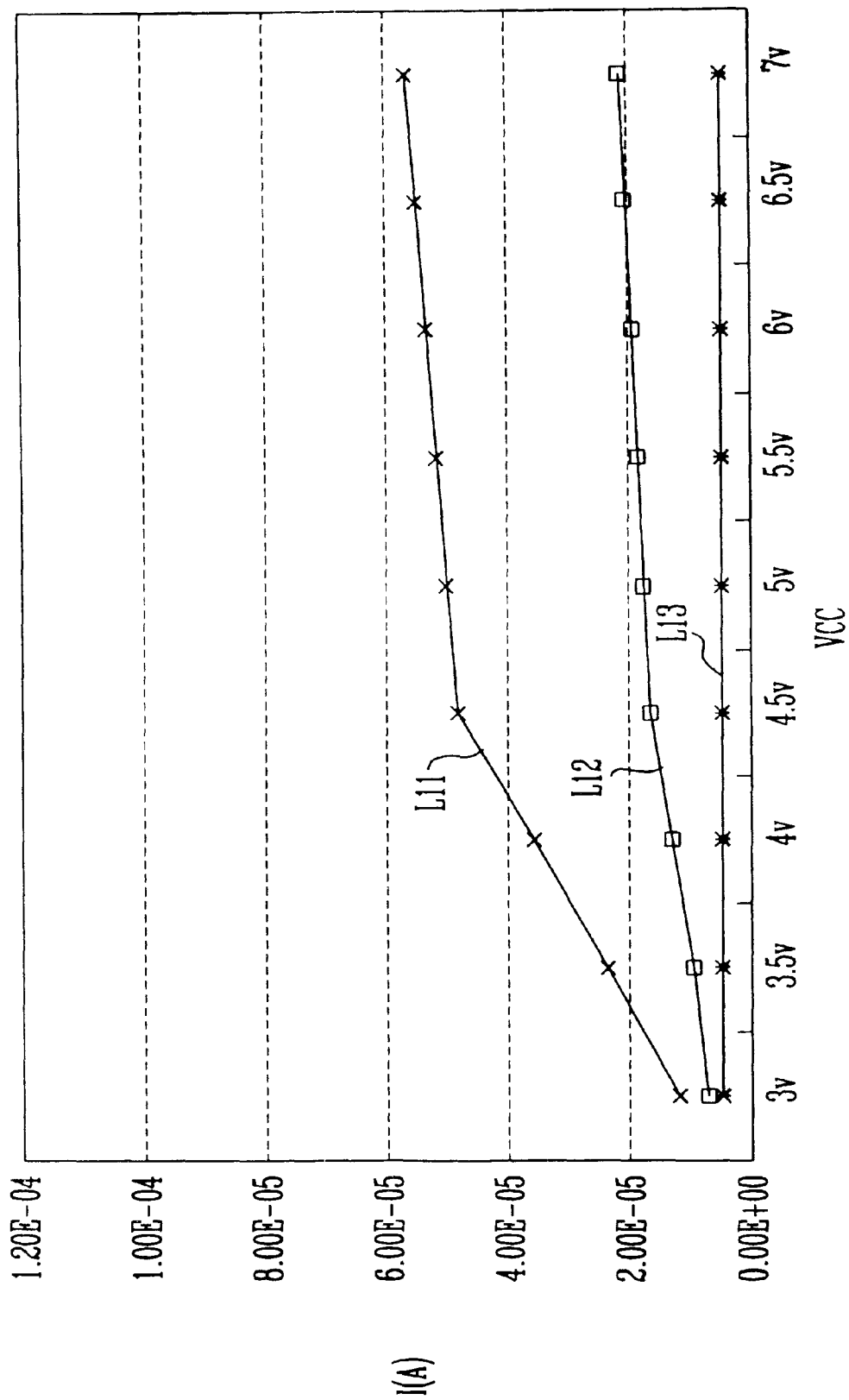
FIG. 4 is a characteristic graph of a cell current depending on the variations in the supply power when the regulation circuit according to the present invention is used.

FIG. 4 is a graph showing the variations in a cell current depending on the variations in the supply power when the word line voltage regulation circuit according to the present invention is used, wherein it is assumed that the threshold voltage of the reference cell and the erase cell is 2V and the threshold voltage of the programming cell is 4.5V being the worst condition. The L11 curve represents the current of the erase cell and the L12 curve is the reference line in case of ⅓ of the reference cell current. The cell having the current over L12 is recognized as an erase cell and the cell having the current below L12 is recognized as a program cell.

Let us review the variations in the cell current depending on the variations in the supply voltage. When the supply voltage becomes about 4.5V, the L11 and L12 are increased with a constant inclination, but L13 being the program cell current line is rarely increased. Then, let us review the case that supply voltage is increased over 4.5V. As the gate voltage is kept constant, L11 and L12 are no longer increased. Also, as the gate voltage of L13 is also 4.5V, the program cell current rarely flows. This is because the width in the current difference of the L12 and L13 is not reduced, even though the supply voltage is increased over 7V. Therefore, even at a higher voltage, the read-out margin of the program cell is not reduced, thus completely preventing the noise and a wrong reading of data due to reduction in the cell current difference upon a reading operation even at a high supply voltage.

As mentioned above, the regulation circuit according to the present invention is constructed to apply a regulated voltage to the word line with a constant voltage in order to read out a cell. Thus, the present invention completely prevents a wrong reading of data since the cell current margin can be sufficiently secured even at a higher supply voltage. Also it can improve the operational reliability of a device since it can reduce noise due to shortage of cell current margin.

The present invention has been described with reference to a particular embodiment in connection with a particular application. Those having ordinary skill in the art and access to the teachings of the present invention will recognize additional modifications and applications within the scope thereof It is therefore intended by the appended claims to cover any and all such applications, modifications, and embodiments within the scope of the present invention.

What is claimed is:

1. A word line voltage regulation circuit having a supply voltage, the word line voltage regulation circuit comprising:
   a first comparator for comparing a first reference voltage with potential of an output node, and outputting a first comparator output in response thereto;
   a first switching element for supplying the supply voltage to said output node depending on said first comparator output;
   a second comparator for comparing a second reference voltage with the potential of said output node, and outputting a second comparator output in response thereto;
   a second switching element for regulating the potential of said output node depending on the said second comparator output;
   a third switching element for transmitting the potential of said output node to a decoder circuit depending on a first control signal; and
   a fourth switching element for supplying said supply voltage to said decoder circuit depending on a second control signal;
   wherein said first switching element is a PMOS transistor connected between the supply voltage and said output node.

2. The word line voltage regulation circuit according to claim 1, wherein said second switching element is a NMOS transistor connected between said output node and a ground terminal.

3. The word line voltage regulation circuit according to claim 1, wherein said third switching element is a PMOS transistor that is driven depending on a chip enable bar signal.

4. The word line voltage regulation circuit according to claim 1, wherein said fourth switching element is a PMOS transistor connected between the supply voltage and the input terminal of said decoder circuit and is driven by an inverted signal of the chip enable bar signal.

5. The word line voltage regulation circuit according to claim 1, wherein the first reference voltage is about 4.45 volts.

6. The word line voltage regulation circuit according to claim 1, wherein the second reference voltage is about 4.55 volts.

7. A word line voltage regulation circuit having a supply voltage, the word line voltage regulation circuit comprising:
   a first comparator for comparing a first reference voltage with a potential of an output node, and outputting a first comparator output in response thereto;
   a first switching element for supplying the supply voltage to said output node depending on said first comparator output;

a second comparator for comparing a second reference voltage with the potential of said output node, and outputting a second comparator output in response thereto;

a second switching element for regulating the potential of said output node depending on the said second comparator output;

a third switching element for transmitting the potential of said output node to a decoder circuit depending on a first control signal; and a fourth switching element for supplying said supply voltage to said decoder circuit depending on a second control signal;

wherein the supply voltage, and the first reference voltage and the output node are distinct.

8. The word line voltage regulation circuit according to claim 7, wherein said first switching element is a PMOS transistor connected between the supply voltage and said output node.

9. The word line voltage regulation circuit according to claim 7, wherein said second switching element is a NMOS transistor connected between said output node and a ground terminal.

10. The word line voltage regulation circuit according to claim 7, wherein said third switching element is a PMOS transistor that is driven depending on a chip enable bar signal.

11. The word line voltage regulation circuit according to claim 7, wherein said fourth switching element is a PMOS transistor connected between the supply voltage and the input terminal of said decoder circuit and is driven by the inverted signal of the chip enable bar signal.

12. The word line voltage regulation circuit according to claim 7, wherein the first reference voltage is about 4.45 volts.

13. The word line voltage regulation circuit according to claim 7, wherein the second reference voltage is about 4.55 volts.

14. A word line voltage regulation circuit having a supply voltage, the word line voltage regulation circuit comprising:

a first comparator for comparing a first reference voltage with a potential of an output node, and outputting a first comparator output in response thereto;

a first switching element for supplying the supply voltage to said output node depending on said first comparator output;

a second comparator for comparing a second reference voltage with the potential of said output node, and outputting a second comparator output in response thereto;

a second switching element for regulating the potential of said output node depending on the said second comparator output;

a third switching element for transmitting the potential of said output node to a decoder circuit depending on a first control signal; and a fourth switching element for supplying said supply voltage to said decoder circuit depending on a second control signal; wherein the first reference voltage is about 4.45 volts and the second reference voltage is about 4.55 volts.

15. The word line voltage regulation circuit according to claim 14, wherein said first switching element is a PMOS transistor connected between the supply voltage and said output node.

16. The word line voltage regulation circuit according to claim 14, wherein said second switching element is a NMOS transistor connected between said output node and a ground terminal.

17. The word line voltage regulation circuit according to claim 14, wherein said third switching element is a PMOS transistor that is driven depending on a chip enable bar signal.

18. The word line voltage regulation circuit according to claim 14, wherein said fourth switching element is a PMOS transistor connected between the supply voltage and the input terminal of said decoder circuit and is driven by the inverted signal of the chip enable bar signal.

* * * * *